United States Patent
Seeley

(10) Patent No.: US 9,128,130 B2
(45) Date of Patent: Sep. 8, 2015

(54) SYSTEMS AND METHODS FOR SYNCHRONIZING DISTRIBUTED GENERATION SYSTEMS

(75) Inventor: Nicholas C. Seeley, Pullman, WA (US)

(73) Assignee: Schweitzer Engineering Laboratories, Inc., Pullman, WA (US)

(*) Notice: Subject to any disclaimer, the term of this patent is extended or adjusted under 35 U.S.C. 154(b) by 868 days.

(21) Appl. No.: 13/233,473

(22) Filed: Sep. 15, 2011

(65) Prior Publication Data

US 2013/0073100 A1 Mar. 21, 2013

(51) Int. Cl.
*G05B 11/01* (2006.01)
*G01R 19/25* (2006.01)
*H02H 7/26* (2006.01)

(52) U.S. Cl.
CPC ............ *G01R 19/2513* (2013.01); *H02H 7/261* (2013.01); *Y02E 60/728* (2013.01); *Y04S 10/265* (2013.01)

(58) Field of Classification Search
None
See application file for complete search history.

(56) References Cited

U.S. PATENT DOCUMENTS

| | | |
|---|---|---|
| 4,349,744 A | 9/1982 | Reuther |
| 4,387,336 A | 6/1983 | Joy |
| 4,829,298 A | 5/1989 | Fernandes |
| 4,874,961 A * | 10/1989 | Henderson ............... 307/87 |
| 5,006,846 A | 4/1991 | Granville |
| 5,224,011 A | 6/1993 | Yalla |
| 5,341,265 A | 8/1994 | Westrom |
| 5,446,682 A | 8/1995 | Janke |
| 5,498,956 A | 3/1996 | Kinney |
| 5,592,393 A | 1/1997 | Yalla |
| 5,596,492 A | 1/1997 | Divan |
| 5,694,281 A | 12/1997 | Roberts |
| 5,703,745 A | 12/1997 | Roberts |
| 5,731,943 A | 3/1998 | Roberts |
| 5,963,404 A | 10/1999 | Guzman-Casillas et al. |
| 6,028,754 A | 2/2000 | Guzman-Casillas et al. |
| 6,236,949 B1 | 5/2001 | Hart |
| 6,265,881 B1 | 7/2001 | Meliopoulos |
| 6,285,917 B1 | 9/2001 | Sekiguchi |
| 6,341,055 B1 | 1/2002 | Guzman-Casillas |
| 6,356,421 B1 | 3/2002 | Guzman-Casillas et al. |
| 6,356,471 B1 | 3/2002 | Fang |
| 6,411,865 B1 | 6/2002 | Qin |
| 6,442,010 B1 | 8/2002 | Kasztenny |
| 6,446,682 B1 | 9/2002 | Viken |
| 6,603,298 B2 | 8/2003 | Guzman-Casillas et al. |

(Continued)

OTHER PUBLICATIONS

Robert J. Best, D. John Morrow, David J. McGowan, Peter A. Crossley, Synchronous Islanded Operation of a Diesel Generator, IEEE Transactions on Power Systems, vol. 22, No. 4, Nov. 2007.

(Continued)

*Primary Examiner* — Sean Shechtman
(74) *Attorney, Agent, or Firm* — John P. Davis

(57) ABSTRACT

A system for managing and synchronizing the operation of an electric power generation and delivery system that includes a number of generators configured to provide distributed electric power generation is disclosed. In the disclosed system, a number of intelligent electronic devices coupled with at distributed generators may be utilized to synchronize the operation of the generators with the system when the generators become isolated from the system. In some embodiments, the disclosed intelligent electronic devices may control the speed of isolated generators based on synchronization information received from at least one other intelligent electronic device and a common time signal.

17 Claims, 3 Drawing Sheets

(56) References Cited

U.S. PATENT DOCUMENTS

| | | | |
|---|---|---|---|
| 6,608,742 B2 | 8/2003 | Schweitzer | |
| 6,662,124 B2 | 12/2003 | Schweitzer | |
| 6,694,270 B2 | 2/2004 | Hart | |
| 6,757,146 B2 | 6/2004 | Benmouyal | |
| 6,839,210 B2 | 1/2005 | Roberts | |
| 6,845,333 B2 | 1/2005 | Anderson | |
| 6,915,186 B2 * | 7/2005 | Patterson, Jr. | 700/286 |
| 6,946,753 B2 | 9/2005 | Kernahan | |
| 7,072,744 B2 | 7/2006 | Kuwabara | |
| 7,116,010 B2 | 10/2006 | Lasseter | |
| 7,196,884 B2 | 3/2007 | Guzman-Casillas et al. | |
| 7,319,576 B2 | 1/2008 | Thompson | |
| 7,356,422 B2 | 4/2008 | Schweitzer | |
| 7,457,688 B2 | 11/2008 | Szepek | |
| 7,480,580 B2 | 1/2009 | Zweigle | |
| 7,570,469 B2 | 8/2009 | Guzman-Casillas et al. | |
| 7,582,986 B2 | 9/2009 | Folkers | |
| 7,630,863 B2 | 12/2009 | Zweigle | |
| 7,635,967 B2 | 12/2009 | Loucks | |
| 7,660,088 B2 | 2/2010 | Benmouyal | |
| 7,710,693 B2 | 5/2010 | Guzman-Casillas et al. | |
| 7,761,910 B2 | 7/2010 | Ransom | |
| 7,856,327 B2 | 12/2010 | Schweitzer | |
| 7,903,381 B2 | 3/2011 | Fischer | |
| 7,930,117 B2 | 4/2011 | Guzman-Casillas | |
| 8,082,367 B2 | 12/2011 | Etheridge | |
| 8,410,633 B2 | 4/2013 | Batzler | |
| 8,560,255 B2 | 10/2013 | Elwarry | |
| 8,766,479 B2 * | 7/2014 | Dorn et al. | 307/82 |
| 2004/0021470 A1 | 2/2004 | Adams | |
| 2004/0027748 A1 | 2/2004 | Kojovic | |
| 2004/0059469 A1 | 3/2004 | Hart | |
| 2004/0138834 A1 | 7/2004 | Blackett | |
| 2004/0252525 A1 | 12/2004 | Aldridge | |
| 2005/0144437 A1 | 6/2005 | Ransom | |
| 2006/0224336 A1 | 10/2006 | Petras | |
| 2006/0259255 A1 | 11/2006 | Anderson | |
| 2007/0055889 A1 * | 3/2007 | Henneberry et al. | 713/186 |
| 2007/0086134 A1 | 4/2007 | Zweigle | |
| 2007/0100504 A1 | 5/2007 | Moxley | |
| 2007/0103004 A1 | 5/2007 | Chou | |
| 2007/0219755 A1 | 9/2007 | Williams | |
| 2007/0222294 A1 | 9/2007 | Tsukida | |
| 2007/0239372 A1 | 10/2007 | Schweitzer | |
| 2008/0040296 A1 | 2/2008 | Bridges | |
| 2008/0204044 A1 | 8/2008 | Ponnaluri | |
| 2008/0225452 A1 * | 9/2008 | Stoupis et al. | 361/62 |
| 2008/0232005 A1 | 9/2008 | Kuehnle | |
| 2008/0281540 A1 | 11/2008 | Zweigle | |
| 2009/0021082 A1 | 1/2009 | Loucks | |
| 2009/0079266 A1 | 3/2009 | McNamara | |
| 2009/0085407 A1 | 4/2009 | Venkatasubramanian | |
| 2009/0088989 A1 | 4/2009 | Guzman-Casillas | |
| 2009/0088990 A1 | 4/2009 | Schweitzer | |
| 2009/0089608 A1 | 4/2009 | Guzman-Casillas | |
| 2009/0091867 A1 | 4/2009 | Guzman-Casillas | |
| 2009/0099798 A1 | 4/2009 | Gong | |
| 2009/0125158 A1 | 5/2009 | Schweitzer | |
| 2009/0198383 A1 | 8/2009 | Gardner | |
| 2009/0254655 A1 | 10/2009 | Kidwell | |
| 2009/0276173 A1 | 11/2009 | Wang | |
| 2010/0002348 A1 | 1/2010 | Donolo | |
| 2010/0104847 A1 | 4/2010 | Ciavatta | |
| 2010/0114390 A1 | 5/2010 | Stevenson | |
| 2010/0145536 A1 | 6/2010 | Masters | |
| 2010/0152910 A1 | 6/2010 | Taft | |
| 2010/0198423 A1 | 8/2010 | Hirst | |
| 2011/0004324 A1 | 1/2011 | Bickel | |
| 2011/0022734 A1 | 1/2011 | Etheridge | |
| 2011/0062708 A1 | 3/2011 | Prochaska | |
| 2011/0068576 A1 | 3/2011 | Meier | |
| 2011/0077885 A1 | 3/2011 | Zweigle | |
| 2011/0190958 A1 | 8/2011 | Hirst | |
| 2011/0213606 A1 | 9/2011 | Seaman | |
| 2011/0251732 A1 | 10/2011 | Schweitzer | |
| 2011/0298286 A1 | 12/2011 | Batzler | |
| 2012/0226386 A1 | 9/2012 | Kulathu | |

OTHER PUBLICATIONS

Olof Samuelsson, Helga Johannsdottir, Nils Gustavsson, Thorhallur Hrafnsson, Daniel Karlsson, Mike Kockott, Johan Salj, Arve Sollie, Power System Damping in Iceland Based on Phasor Measurements, Jul. 2, 2006.

Gabriel Benmouyal, E. O. Schweitzer, A. Guzman, Synchronized Phasor Measurement in Protective Relays for Protection, Control, and Analysis of Electric Power Systems, 29th Annual Western Protective Relay Conference, Oct. 22-24, 2002.

A.G. Phadke, Synchronized Phasor Measurement in Power Systems, IEEE Comput. Appl., vol. 6, No. 2, pp. 10-15, Apr. 1993.

Edmund O. Schweitzer, III, David Whitehead, Armando Guzman, Yanfeng Gong, Marcos Donolo, Advanced Real-Time Synchrophasor Applications, Western Protective Relay Conference, Oct. 2008.

Dale Williston, Dale Finney, Consequences of Out-of-Phase Reclosing on Feeders with Distributed Generators, Dec. 3, 2010.

Michael J. Thompson, Fundamentals and Advancements in Generator Synchronizing Systems, Dec. 9, 2010.

Michael J. Thompson, New Developments in Generator Synchronizing Systems, Feb. 10, 2011.

Greg Zweigle, Expand Synchrophasor Capabilities with the Substation Phasor Data Concentrator, Feb. 18, 2010.

Andrew Swinghamer, Create a Synchrophasor Network with the SEL-3378 Synchrophasor Vector Processor, Aug. 6, 2009.

Yanfeng Gong, Using Synchrophasor-Based Modal Analysis to Detect Unstable Power System Oscillations, Jun. 24, 2009.

Schweitzer Engineering Laboratories, Inc., Case Study, Powergrid Corporation—India, Using Wide-Area Synchrophasor Measurements to Improve System Reliability, Sep. 10, 2010.

Schweitzer Engineering Laboratories, Inc., SEL-3378 Instruction Manual, Apr. 4, 2008.

Schweitzer Engineering Laboratories, Inc., SEL-3530 Real-Time Automation Controller RTAC Instruction Manual, Sep. 15, 2009.

Terry L. Conrad, Distributed State Estimator at U.S. Virgin Islands Water and Power Authority St. Thomas and St. John, NASPI Working Group Meeting, Mar. 7, 2008.

A.P. Sakis Meliopoulos, George J. Cokkinides, Floyd Galvan, Bruce Fardanesh, Distributed State Estimator—Advances and Demonstration, 41st Annual Hawaii International Conference on System Sciences, Jan. 2008.

Pserc-Ali Abur andMladen Kezunovic, Sakis Meliopoulos, Enhanced State Estimation by Advanced Substation Monitoring, Power Systems Engineering Research Center, Nov. 2002.

Saman A. Zonouz and William H. Sanders, A Kalman-based Coordination for Hierarchical State Estimation: Algorithm and Analysis, 41st Annual Hawaii International Conference on System Sciences, Jan. 2008.

ABB: Improved Power System Performance through Wide Area Monitoring, Protection, and Control, Jan. 2004.

ABB, Wide Area Measurement, Monitoring, Protection and Control Industrial IT for Energy System Operation, Jan. 2003.

Sasa Jakovljevic, Mladen Kezunovic, Software for Enhanced Monitoring in Integrated Substations, 2003 IEEE Bologna Power Tech Conference, Jun. 23-26, 2003.

Y. Wu, M. Kezunovic, Automatic Simulation of IED Measurements for Substation Data Integration Studies, Power Engineering Society General Meeting, Jun. 12-16, 2005.

Sasa Jakovljevic, Data Collecting and Processing for Substation Integration Enhancement, May 2003.

M. Kezunovic, G. Latisko, Automated Monitoring Functions for Improved Power System Operation and Control, Power Engineering Society General Meeting, Jun. 12-16, 2005.

PCT/US2011/046437 International Search Report and Written Opinion of the International Searching Authority, Patent Cooperation Treaty, Dec. 16, 2011.

Arshad Saleem, Agent Services for Situation Aware Control of Power Systems with Distributed Generation, 2009 IEEE [retrieved on Jan.

(56) References Cited

OTHER PUBLICATIONS 28, 2013 from the internet <url:http://orbit.dtu.dk/fedora/objects/orbit:55496/datastreams/file__3761170/content> ].

Chanin Choniratisai, HVDC Stability Functions and Implementation in Thailand, CEPSI 2004. [retrieved on Jan. 28, 2013 from the internet <URL://http://www.researchgate.net/CEPSI2004> ].

PCT/US2012/0068962 International Search Report and Written Opinion of the International Searching Authority, Patent Cooperation Treaty, Feb. 25, 2013.

G.T. Heydt, C.C. Liu, A.G. Phadke, V. Vittal, Solutions for the Crisis in Electric Power Supply, IEEE Computer Applications in Power, Jul. 2001.

Luc Meysenc, M. Jylhakallio, Peter Barbosa, Power Electronics Cooling Effectiveness Versus Thermal Inertia, IEEE Transactions on Power Electronics, vol. 20, No. 3, May 2005.

R.A. Walling, N.W. Miller, Distributed Generation Islanding—Implications on Power System Dynamic Performance, IEEE Power Enginnering Society Summer Meeting vol. 1, Jul. 25, 2002.

M. Ezzt, M.I. Marei, M. Abdel-Rahman, M.M. Mansour, A Hybrid Strategy for Distributed Generators Islanding Detection, IEEE PES Power Africa 2007 Conference and Exposition Johannesburg, South Africa, May 16-20, 2007.

Mats Larsson, Christian Rehtanz, Predictive Frequency Stability Control Based on Wide-Area Phasor Measurements, IEEE Power Engineering Society Summer Meeting vol. 1, Jul. 2002.

Jun Yin, Liuchen Chang, Chris Diduch, Recent Developments in Islanding Detection for Distributed Power Generation, IEEE Power Engineering, Jul. 2004.

Xiaoming Wang, Vijay Vittal, System Islanding Using Minimal Cutsets with Minimum Net Flow, IEEE Power Systems Conference and Exposition, Oct. 2004.

Dongchen Hu, Vaithianathan Venkatasubramanian, New Wide Area Algorithms for Detection and Mitigation of Angle Instability Using Synchrophasors, IEEE Power Engineering Society General Meeting, Jun. 2007.

PCT/US2012/055107 Patent Cooperation Treaty, International Search Report and Written Opinion of the International Searching Authority, Nov. 23, 2012.

\* cited by examiner

SYSTEMS AND METHODS FOR SYNCHRONIZING DISTRIBUTED GENERATION SYSTEMS

TECHNICAL FIELD

This disclosure relates to systems and methods for controlling the generation of electric power in an electric power generation and delivery system and, more particularly, to systems and methods for controlling and synchronizing the generation of electric power in an electric power generation and delivery system that includes distributed generation capabilities.

BRIEF DESCRIPTION OF THE DRAWINGS

Non-limiting and non-exhaustive embodiments of the disclosure are described, including various embodiments of the disclosure, with reference to the figures, in which.

DETAILED DESCRIPTION

Figure 1:
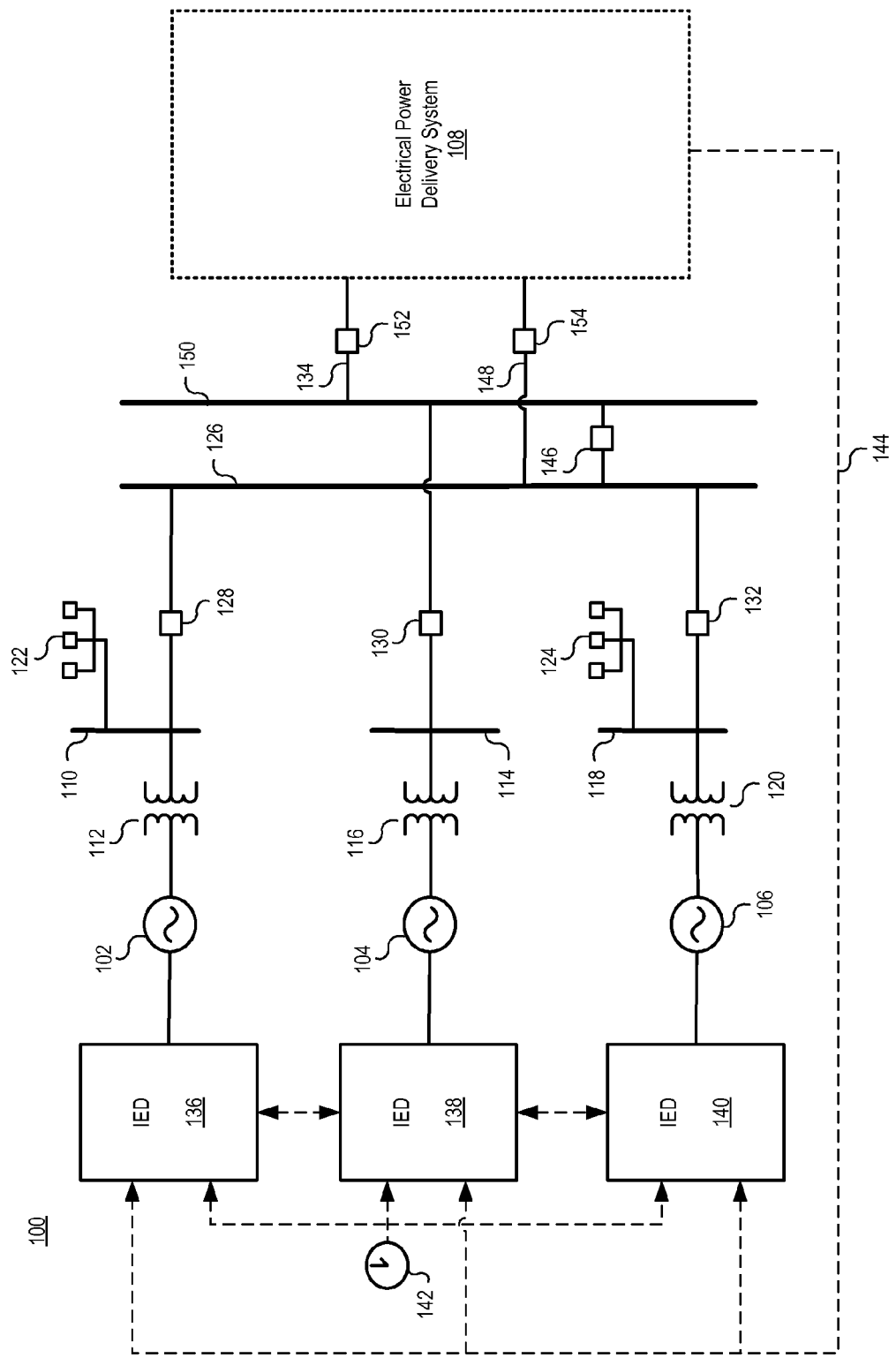
FIG. 1 illustrates a diagram of one embodiment of a system for controlling the generation of electric power in an electric power generation and delivery system that includes distributed electrical generators.

The embodiments of the disclosure will be best understood by reference to the drawings. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor do the steps need be executed only once, unless otherwise specified.

In some cases, well-known features, structures, or operations are not shown or described in detail. Furthermore, the described features, structures, or operations may be combined in any suitable manner in one or more embodiments. It will also be readily understood that the components of the embodiments, as generally described and illustrated in the figures herein, could be arranged and designed in a wide variety of different configurations. For example, throughout this specification, any reference to "one embodiment," "an embodiment," or "the embodiment" means that a particular feature, structure, or characteristic described in connection with that embodiment is included in at least one embodiment. Thus, the quoted phrases, or variations thereof, as recited throughout this specification are not necessarily all referring to the same embodiment.

Several aspects of the embodiments described are illustrated as software modules or components. As used herein, a software module or component may include any type of computer instruction or computer executable code located within a memory device that is operable in conjunction with appropriate hardware to implement the programmed instructions. A software module or component may, for instance, comprise one or more physical or logical blocks of computer instructions, which may be organized as a routine, program, object, component, data structure, etc., that performs one or more tasks or implements particular abstract data types.

In certain embodiments, a particular software module or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a non-transitory machine-readable medium having stored thereon instructions that may be used to program a computer or other electronic device to perform processes described herein. The non-transitory machine-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of media/machine-readable medium suitable for storing electronic instructions. In some embodiments, the computer or other electronic device may include a processing device such as a microprocessor, microcontroller, logic circuitry, or the like. The processing device may further include one or more special purpose processing devices such as an application specific interface circuit (ASIC), PAL, PLA, PLD, field programmable gate array (FPGA), or any other customizable or programmable device.

Electrical power generation and delivery systems are designed to generate, transmit, and distribute electrical energy to loads. Electrical power generation and delivery systems may include equipment, such as electrical generators, electrical motors, power transformers, power transmission and distribution lines, circuit breakers, switches, buses, transmission lines, voltage regulators, capacitor banks, and the like. Such equipment may be monitored, controlled, automated, and/or protected using intelligent electronic devices (IEDs) that receive electric power system information from the equipment, make decisions based on the information, and provide monitoring, control, protection, and/or automation outputs to the equipment.

In some embodiments, an IED may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communication processors, computing platforms, programmable logic controllers (PLCs), programmable automation controllers, input and output modules, governors, exciters, statcom controllers, SVC controllers, OLTC controllers, and the like. Further, in some embodiments, IEDs may be communicatively connected via a network that includes, for example, multiplexers, routers, hubs, gateways, firewalls, and/or switches to facilitate communications on the networks, each of which may also function as an IED. Networking and communication devices may also be integrated into an IED and/or be in communication with an IED. As used herein, an IED may include a single discrete IED or a system of multiple IEDs operating together.

In certain electrical power generation and delivery systems, generation of electric power may be distributed. For example, in some electric power generation and delivery systems, one or more remotely located (i.e., distributed) electrical generators may generate electric power that is delivered by the system to meet greater system load demands. In certain embodiments, distributed electrical generators may be associated with power sub-grids within a greater grid topology of the electric power delivery system.

Electrical power generation and delivery system equipment may be monitored and protected from various malfunctions and/or conditions using one or more IEDs. In some circumstances, protecting the system from such malfunctions and/or conditions may require one or more IEDs to isolate a power sub-grid from the greater topology of the electric power delivery system. For example, when the power generation capabilities of an electric power system cannot adequately supply system loads, certain portions of the electric power system may be disconnected and/or isolated from the greater grid topology of the electric power delivery system using one or more IEDs in order to prevent damage to the system and/or its components. Isolating certain portions of the electric power system may also help to contain various malfunctions and/or conditions within the isolated portions and prevent undesirable service outages (e.g., blackout conditions) affecting a larger portion of the electric power delivery system.

Conventionally, when portions of an electric power delivery system that include distributed electrical generators are isolated from the greater topology of the electric power deliver system, it may be necessary to shut down the electrical generators due to lack of an ability to adequately control and synchronize the generators. Particularly, if left operating, electrical generation in isolated portions of the electric power system may have a generated voltage phase angle and/or an operating frequency that drifts relative to that of the greater electric power system. Reconnecting the isolated portions of the electric power system after such drift may cause damage to the previously isolated portion and/or the greater system.

Disclosed herein are systems and methods that allow electrical generators included in an isolated portion of an electric power system to remain operating synchronously with the greater electric power system. By synchronizing the operation of distributed electrical generators of an isolated portion of an electric power system with that of the greater grid, the need to shut down the generators of the isolated portion is reduced. Moreover, synchronizing the operation may allow the isolated portion of the electrical power system to be reconnected to the greater grid without causing damage to the isolated portion and/or the greater grid.

FIG. 1 illustrates a diagram of one embodiment of a system 100 for controlling the generation of electric power in an electric power generation and delivery system that includes distributed electrical generators 102-106 consistent with embodiments disclosed herein. Although illustrated as one-line diagram for purposes of simplicity, the system 100 may also be configured as a three phase power system. Moreover, embodiments disclosed herein may be utilized in any electric power generation and delivery system, and are therefore not limited to the specific system 100 illustrated in FIG. 1. For example, systems consistent with embodiments disclosed herein may include any number of distributed electrical generators 102-106, and may be integrated in any suitable configuration. Further, embodiments may be integrated, for example, in industrial plant power generation and delivery systems, deep-water vessel power generation and delivery systems, ship power generation and delivery systems, distributed generation power generation and delivery systems, and utility electric power generation and delivery systems.

The system 100 may include generation, transmission, distribution, and power consumption equipment. For example, the system 100 may include one or more generators 102-106 that, in some embodiments, may be operated by a utility provider for generation of electrical power for the system 100. In certain embodiments, the generators 102-106 may be associated with one or more sub-grids within a greater topology of an electric power delivery and generation system and be configured to provide power to the sub-grids and/or the greater electrical power delivery system 108. A first generator 102 may be coupled to a first transmission bus 110 via a first step up transformer 112 that may be configured to step up the voltage provided to the first transmission bus 110 from the first generator 102. A second generator 104 may be coupled to a second transmission bus 114 via a second step up transformer 116 that may be configured to step up the voltage provided to the second transmission bus 114 from the second generator 104. A third generator 106 may be coupled to a third transmission bus 118 via a third step up transformer 120 that may be configured to step up the voltage provided to the third transmission bus 118 from the third generator 106.

A first set of one or more loads 122 may be coupled to the first transmission bus 110 and receive electrical power generated by the first generator 102. Similarly, a second set of one or more loads 124 may be coupled to the third transmission bus 118 and receive electrical power generated by the third generator 106. In some embodiments, the electric power delivered to the loads 122, 124 may be further stepped down from distribution levels to load levels via step down transformers included in the system (not shown). In certain embodiments, the loads 122, 124 may be associated with a distribution site (e.g., a refinery, smelter, paper production mill, or the like), which may include a distributed generator (not shown) configured to provide power to the distribution site produced by, for example, a turbine configured to produce electric power from the burning of waste, the use of waste heat, or the like. Further, while the system 100 illustrated in FIG. 1 does not include, for example, loads coupled to the second transmission bus 114, embodiments disclosed herein may be incorporated in a system that includes any suitable configuration of loads, electrical generators, busses, feeders, transformers, transmissions lines, IEDs, breakers, and the like.

The first transmission bus 110 and third transmission bus 118 may be coupled to a main first transmission bus 126 via a first breaker 128 and a third breaker 132, respectively. The second transmission bus 114 may be coupled to a second main transmission bus 150 via a second breaker 130. The first main transmission bus 126 may be coupled to the second main transmission bus via breaker 146. The first main transmission bus 126 may be coupled to the greater electric power delivery system 108 via a first transmission line 148 and a breaker 154. The second main transmission bus 150 may be coupled to the greater electric power delivery system 108 via a second transmission line 134 and a breaker 152. The greater electric power delivery system 108 may include any suitable configuration of distributed generators, loads, transmission components, and the like.

As discussed above, IEDs may be configured to control, monitor, protect, and/or automate the system 100 and/or its components. As used herein, an IED may refer to any microprocessor-based device that monitors, controls, automates, and/or protects monitored equipment within an electric power system. In some embodiments, IEDs may gather status information from one or more pieces of monitored equipment. Further, IEDs may receive information concerning monitored equipment using sensors, transducers, actuators, and the like.

In some embodiments, IEDs may be configured to monitor and communicate information, such as voltages, currents, equipment status, temperature, power system frequency, pressure, density, infrared absorption, radio-frequency information, partial pressures, velocity, speed, rotational velocity, mass, switch status, valve status, circuit breaker status, tap status, meter readings, and the like. Further, IEDs may be configured to communicate calculations, such as phasors (which may or may not be synchronized as synchrophasors), events, fault distances, differentials, impedances, reactances, frequency, and the like. IEDs may also communicate settings information, IED identification information, communications information, status information, alarm information, and the like. Information of the types listed above, or more generally, information about the status of monitored equipment, may be generally referred to herein as monitored system data and/or information.

In certain embodiments, IEDs may issue control instructions to the monitored equipment in order to control various aspects relating to the monitored equipment. For example, one or more IEDs may be in communication with a circuit breaker (e.g., breakers 128-132), and may be capable of sending an instruction to open and/or close the circuit breaker, thus disconnecting (i.e., isolating) or connecting a portion of a power system. In another example, an IED may be in communication with a recloser and capable of controlling reclosing operations of the recloser. In another example, an IED may be in communication with a voltage regulator and capable of instructing the voltage regulator to tap up and/or down. Information of the types listed above, or more generally, information or instructions directing an IED or other device to perform a certain action, may be generally referred to as control instructions.

The operation of generators 102-106 may be controlled by IEDs 136-140 through control instructions issued by the IEDs 136-140. In certain embodiments, the IEDs 136-140 may operate as speed controllers for the generators 102-106. For example, IED 136 may control the speed (e.g., the rotational speed) and operation of generator 102, thereby controlling the generation of electricity by generator 102. In conventional IEDs operating as speed controllers, the IED may receive both an indication of a reference speed (e.g., from a preset signal or the like) and status information providing an indication of the actual speed of the generator. Through a feedback system, the conventional IED operating as a speed controller may control the generator to adjust its actual speed to match that of the indicated reference speed.

As discussed above, when an electrical generator becomes isolated from the greater topology of an electric power delivery system, even when the generator is speed controlled by an IED according to a reference speed indication, the voltage phase angle and/or frequency of the generated electric power may drift relative to that of the greater electric power system. A resulting angle difference may cause damage to the isolated portion and/or the greater electric power system if the isolation portion is recoupled to the system. Consistent with embodiments disclosed herein, IEDs 136-140 may be configured to synchronize the speed of the generators 102-106 based, at least in part, on monitored system data 144 received from the greater electrical power delivery system 108, information received from other IEDs 136-140, a reference speed indication, and/or a common time signal 142. By synchronizing the speed of the generators 102-106 based on operating conditions of the greater electrical power delivery system 108 as indicated by monitored system data 144, information received from other IEDs 136-140, a reference speed or phase indication, and/or a common time signal 142 rather than a fixed reference speed or phase, the generators 102-106 may remain synchronized with the greater electrical power delivery system 108 regardless of whether they are coupled to or isolated (e.g., by opening breakers 128-132) from the greater electrical power delivery system 108.

In certain embodiments, monitored system data 144 relating to the electrical power delivery system 108 may be generated by other IEDs included in the electrical power delivery system 108 designed to monitor, control, and/or protect equipment included in the electrical power delivery system 108. In certain embodiments, the monitored system data 144 may include current signals obtained, for example, from a current transformer (CT), voltage signals obtained, for example, from a potential transformer (PT), and/or time-synchronized phasors (i.e., synchrophasors) of monitored currents and/or voltages obtained from one or more locations in the electrical power delivery system 108. In certain embodiments, synchrophasor data may be calculated by IEDs included in the electrical power delivery system 108 and/or IEDs 136-140 using a variety of methods including, for example, the methods described in U.S. Pat. No. 6,662,124, U.S. Pat. No. 6,845,333, and U.S. Pat. No. 7,480,580, which are herein incorporated by reference in their entireties. In some embodiments, synchrophasor measurements and communications may comply with the IEC C37.118 protocol.

Based in part on the received monitored system data 144, the IEDs 136-140 may, autonomously or collectively, control the operation of generators 102-106 such that the output of the generators 102-106 (e.g., speed, phase angle, and/or frequency) is synchronized with the greater electric power delivery system 108. In this manner, the generators 102-106 may remain synchronized with the greater electrical power delivery system 108 regardless of whether they are coupled to or isolated from the greater electrical power delivery system 108.

In certain embodiments, IEDs 136-140 may receive a common time signal 142 that is used in synchronizing the generators 102-106 (e.g., by applying time stamps or the like). IEDs and equipment included in the greater electrical power delivery system 108 may also utilize the common time signal 142 to manage, control, and synchronize their operations. In some embodiments, the common time signal 142 may be provided using a GPS satellite (e.g., IRIG), a common radio signal such as WWV or WWVB, a network time signal such as IEEE 1588, or the like. As the common time signal 142 may be shared between the IEDs 136-140 configured to control generators 102-106 as well as IEDs and equipment included in the greater electrical power delivery system 108, the common time signal 142 may be utilized as a common reference for coordinating and synchronizing the operation of the entire system 100.

As illustrated in FIG. 1, IEDs 136-140 may be communicatively coupled with each other, allowing some IEDs 136-140 to operate autonomously (i.e., individually) and/or as a group. In certain embodiments, an IED of the IEDs 136-140 may be able to determine their relative position and/or relative interconnectivity with respect to other IEDs 136-140 in the system 100 they are connected with (i.e., the IEDs 136-140 may be "system aware"). Further, in some embodiments, IEDs 136-140 may be able to determine if they are isolated (i.e., islanded) from the greater electrical power delivery system 108 on a specific sub-grid. For example, if breaker 128 and breaker 132 are opened (e.g., in response to control instructions issued by one or more IEDs), IED 136 and IED 140 may determine that they are communicatively coupled with each other and that they or the equipment they are associated with has become isolated (i.e., islanded) from the greater electrical power delivery system 108 on a particular sub-grid.

In certain embodiments, IEDs 136-140 may determine whether they or the equipment they are associated with has become isolated from the greater electrical power delivery system 108 and/or determine whether they reside on a particular sub-grid (i.e., island) based on monitored system data including, for example, system operating frequencies, operating phases, and/or synchrophasor measurements provided by one or more IEDs monitoring the system 100. In certain embodiments, this determination may be performed using a variety of methods including, for example, the methods described in U.S. Pat. No. 7,930,117, which is herein incorporated by reference in its entirety.

Upon determining that a group of IEDs 136-140 are associated with a particular sub-grid (i.e., island), the IEDs 136-140 may determine whether they should control their respective generators 102-106 autonomously (i.e., individually) or collectively (i.e., as a group). In certain embodiments, the determination of whether IEDs 136-140 should control their respective generators 102-106 autonomously or collectively may be based on an optimization process that utilizes monitored system data received by the IEDs 136-140.

If the IEDs 136-140 determine they should control their respective generators 102-106 autonomously, the IEDs 136-140 may independently control their respective generators 102-106 irrespective of the behavior of the other IEDS 136-140. An IED 136-140 controlling its generator 102-106 autonomously may generate a reference phasor signal based on a common time signal 142. The reference phasor signal may be used as a phase input signal to a controller included in the IED 136-140. In certain embodiments, the controller may operate drive an error between the phase input signal and a measured output phase signal to zero.

If any of the combination of IEDs 136-140 determines that they should collectively control their respective generators 102-106, a combination of IEDs 136-140 may operate as a group. Under such circumstances, the group of IEDs 136-140 may collectively share their operating characteristics (e.g., phase or speed reference signals) and operate accordingly and/or operate according to user-defined operating parameters. In certain embodiments, speed and/or phase angle control of the group of IEDs 136-140 may be accomplished using a reference phasor signal generated based on the common time signal 142 and/or monitored system data 144 received from the greater electrical power delivery system 108. For example, if breaker 128, breaker 146, and breaker 132 are opened, IED 136 and IED 140 may determined that they are electrically decoupled from the greater electrical power delivery system 108 and/or each other. IED 136 and IED 140 may then control their respective generators 102, 106 using a common reference time signal 142, information from other IEDs 136-140, and/or monitored system data 144. Once synchronized, a sub-grid including generators 102 and 106 may be established by closing breaker 128 and 132, and IEDs 136 and 132 may collectively control their respective generators using a common reference time signal 142, information from other IEDs 136-140, and/or monitored system data 144. Further, by synchronizing the operation of generator 102 and generator 106 with the greater electrical power delivery system 108, generator 102 and 106 may be reconnected to the greater electrical power delivery system by closing breaker 146.

In certain embodiments, IEDs 136-140 may also be communicatively coupled to a central IED (not shown) that may be configured to provide control and monitoring of the IEDs 136-140 and/or the system 100 as a whole. For example, in certain embodiments, a central IED coupled to IEDs 136-140 may be used in determining whether IEDs 136-140 have become isolated on a particular sub-grid, whether IEDs 136-140 should control their respective generators 102-106 autonomously or collectively, and/or which of IEDs 136-140 should function as a primary IED and/or follower IEDs. In some embodiments, the central IED may be a central controller, synchrophasor vector processor, automation controller, programmable logic controller (PLC), real-time automation controller, Supervisory Control and Data Acquisition (SCADA) system, or the like. For example, in some embodiments, the central IED may be a synchrophasor vector processor, as described in U.S. Patent Application Publication No. 2009/0088990, which is incorporated herein by reference in its entirety. In other embodiments, the central IED may be a real-time automation controller, such as is described in U.S. Patent Application Publication No. 2009/0254655, which is incorporated herein by reference in its entirety. The central IED may also be a PLC or any similar device capable of receiving communications from other IEDs (e.g., IEDS 136-140) and processing the communications therefrom. In certain embodiments, other IEDs (e.g., IEDS 136-140) may communicate with the central IED directly or via a communications network.

Figure 2:
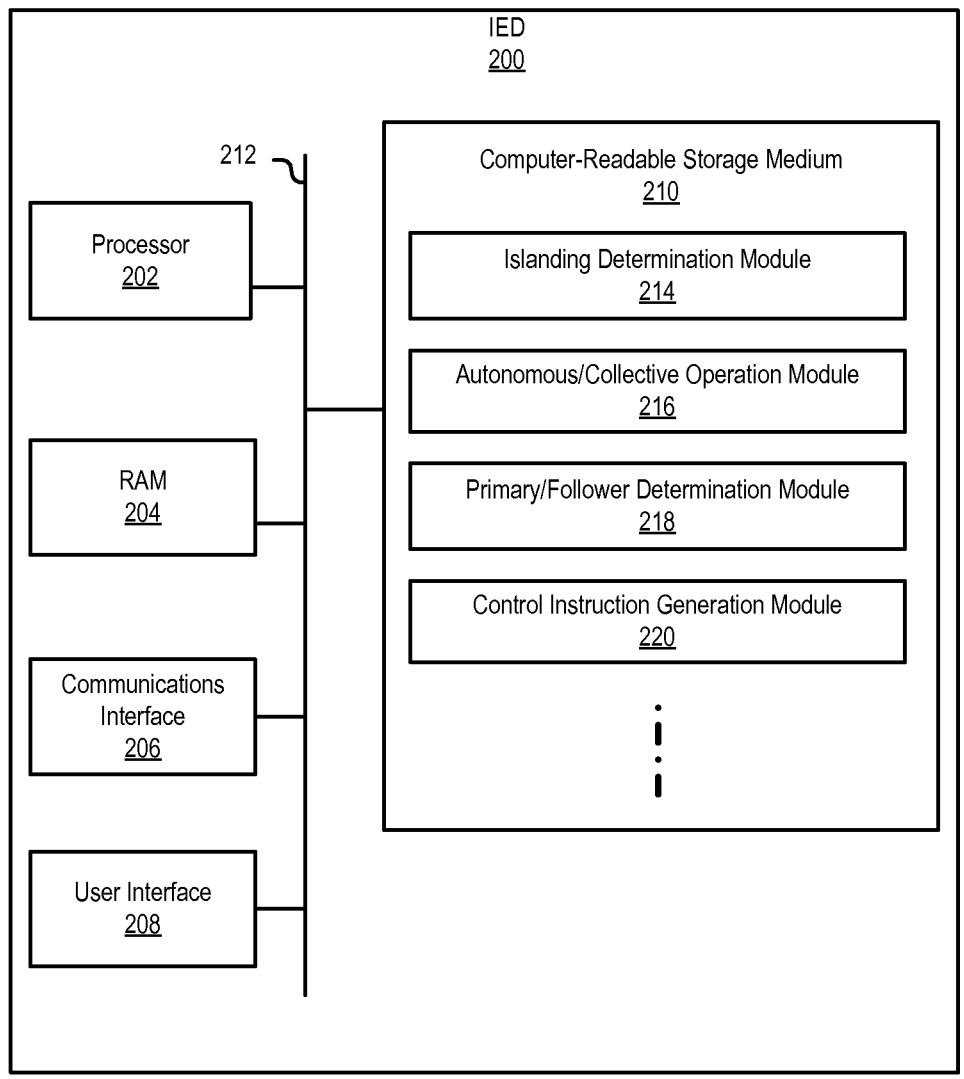
FIG. 2 illustrates a block diagram of an intelligent electronic device for controlling the generation of electric power in an electric power generation and delivery system.

FIG. 2 illustrates a block diagram of an IED 200 for controlling the generation of electric power in an electric power generation and delivery system. As illustrated, IED 200 may include a processor 202, a random access memory (RAM) 204, a communications interface 206, a user interface 208, and a computer-readable storage medium 210. The processor 202, RAM 204, communications interface 206, user interface 208, and computer-readable storage medium 210 may be communicatively coupled to each other via a common data bus 212. In some embodiments, the various components of IED 200 may be implemented using hardware, software, firmware, and/or any combination thereof.

The user interface 208 may be used by a user to enter user defined settings such as, for example, indications of reference speeds, parameters utilized in determining whether a group of IEDs should operate autonomously or collectively, and the like. The user interface 208 may be integrated in the IED 200 or, alternatively, may be a user interface for a laptop or other similar device communicatively coupled with the IED 200. Communications interface 206 may be any interface capable of communicating with IEDs and/or other electric power system equipment (e.g., a generator) communicatively coupled to IED 200. For example, communications interface 206 may be a network interface capable of receiving communications from other IEDs over a protocol such as the IEC 61850 or the like. In some embodiments, communications interface 206 may include a fiber-optic or electrical communications interface for communicating with other IEDs.

The processor 202 may include one or more general purpose processors, application specific processors, microcontrollers, digital signal processors, FPGAs, or any other customizable or programmable processing device. The processor 202 may be configured to execute computer-readable instructions stored on the computer-readable storage medium 210. In some embodiments, the computer-readable instructions may be computer executable functional modules. For example, the computer-readable instructions may include an islanding determination module 214 configured to cause the processor to perform the islanding (i.e., isolated sub-grid) determination operations, as described above in reference to FIG. 1. The computer-readable instructions may further include an autonomous/collective operation module 216 configured to perform the operations related to the above-described determination of whether the IED 200 should operate autonomously or collectively with other IEDs after a determination that the IED 200 is operating on an isolated sub-grid. The computer-readable instructions may also include a primary/follower determination module 218 configured to perform the determinations described above regarding whether a collectively operating IED should operate as a primary IED or a follower IED. In addition, the computer-readable instructions may also include a control instruction generation module 220 configured to generate an appropriate control instruction to control a generator coupled to the IED 200 based on the above-described determinations. The computer-readable instructions may also include any other functional modules configured to implement the functionality of IEDs 102-106 described above in reference to FIG. 1.

Figure 3:
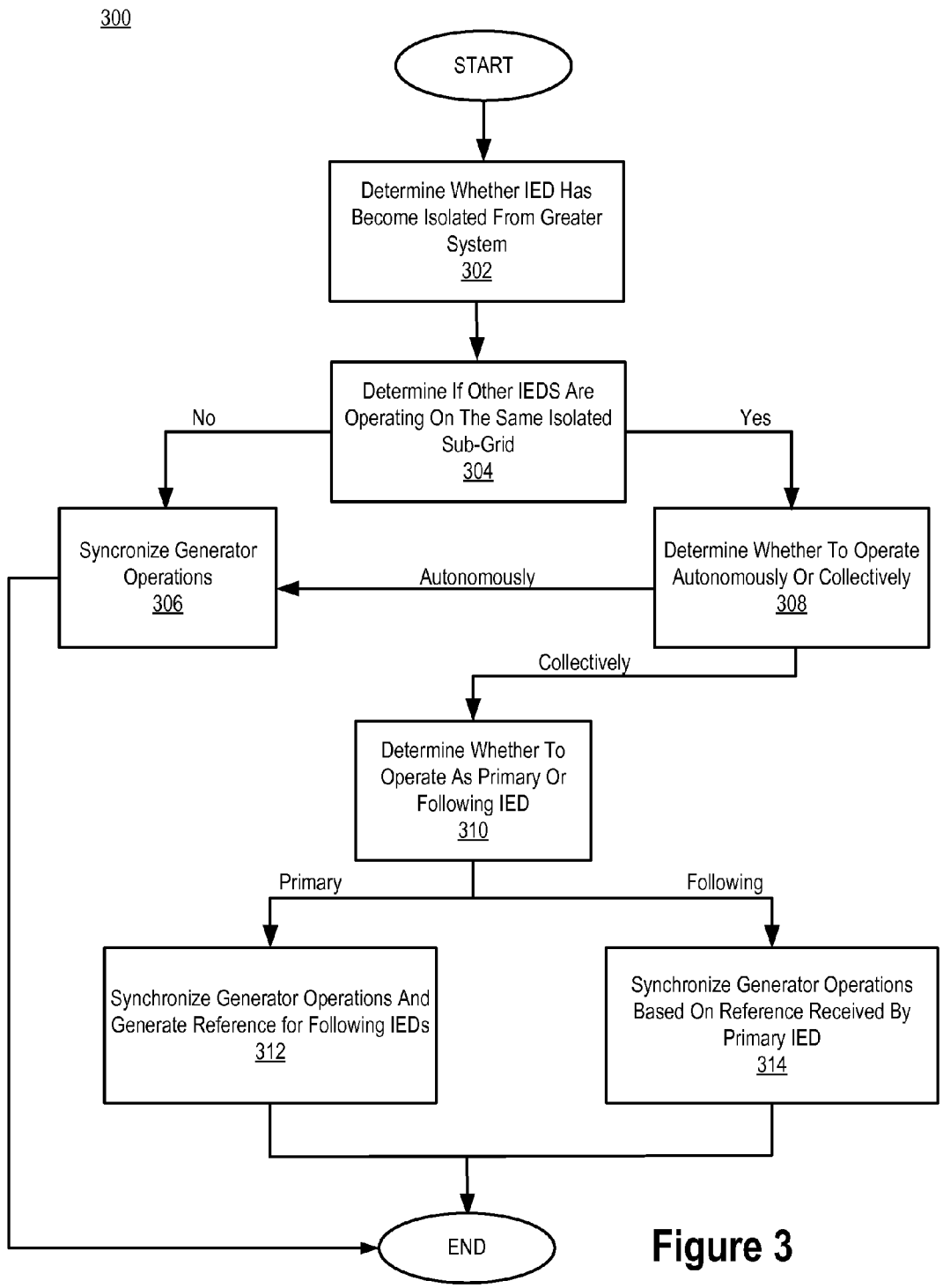
FIG. 3 illustrates a flow diagram of a method for controlling the generation of electric power in an electric power generation and delivery system.

FIG. 3 illustrates a flow diagram of a method 300 for controlling the generation of electric power in an electric power generation and delivery system. At 302, an IED may determine that the IED and/or a generator the IED is configured to monitor and control has become isolated from the greater electric power delivery system. In certain embodiments, this determination may be made using monitored system data received from other IEDs including, for example, synchrophasor measurements. If the IED determines that the IED has become isolated from the greater system, the IED may determine whether other IEDs configured to monitor and control distributed generators have also become isolated from the greater system on the same sub-grid at 304.

If the IED determines that no other IEDs controlling distributed generators are operating on the same isolated sub-grid, at 306 the IED may independently control and synchronize the operation of the generator the IED is configured to control with that of the greater system. In certain embodiments, this synchronization operation may be based on monitored system data (e.g., synchrophasor information), a common time signal (e.g., a GPS timing signal), information received from other IEDs, and/or an indication of a reference speed. If, however, the IED determines other IEDs controlling distributed generators are operating on same isolated sub-grid, at 308 the IED may then determine whether it should operate autonomously or collectively with the other isolated IEDs on the same sub-grid.

When the IED determines that it should operate autonomously, the method may proceed to 306 and the IED may control and synchronize the operation of its associated generator with that of the greater system independent of other IEDs. When the IED determines, however, that it should operate collectively with other IEDs operating on the same isolated sub-grid, the method may proceed to 310. At 310, the IED may determine, individually or collectively with other IEDs, whether the IED should operate as a primary IED or whether it should "follow" another IED operating as a primary IED on the same isolated sub-grid in controlling its associated generator.

If the IED determines that it should operate as a primary IED, at 312, the IED may control and synchronize the operation of its associated generator with that of the greater system and provide a reference to other IEDs on the same isolated sub-grid configured to "follow" the primary IED for use in synchronizing their associated generators. If, however, the IED determines that it should "follow" another primary IED, at 314, the IED may control and synchronize the operation of its associated generator based on a reference received from a primary IED.

While specific embodiments and applications of the disclosure have been illustrated and described, it is to be understood that the disclosure is not limited to the precise configurations and components disclosed herein. Accordingly, many changes may be made to the details of the above-described embodiments without departing from the underlying principles of this disclosure. The scope of the present invention should, therefore, be determined only by the following claims.

What is claimed is:

1. A system for managing an electric power generation and delivery system comprising:
   a plurality of generators configured to provide distributed electric power generation to the electric power generation and delivery system; and
   a plurality of intelligent electronic devices (IEDs), each IED of the plurality of IEDs being communicatively coupled with at least one generator of the plurality of generators, wherein each IED of the plurality of IEDs is configured to:
      determine that a subset of IEDs of the plurality of IEDs and an associated subset of generators of the plurality of generators while generating electric power have been isolated to a same isolated sub-grid of the electric power generation and delivery system, and
      control the speed of an associated generator of the subset of generators based on a phase reference signal received from at least one other IED of the subset of IEDs and a common time signal associated with the plurality of IEDs.

2. The system of claim 1, wherein each IED of the plurality of IEDs is further configured to control the speed of the at least one generator of the plurality of generators based on system information related to the electric power generation and delivery system.

3. The system of claim 2, wherein the system information is provided by one or more monitoring IEDs included in the electric power generation and delivery system.

4. The system of claim 2, wherein the system information comprises synchronized phasor information.

5. The system of claim 1, wherein the phase reference signal further comprises information for determining that the IED should operate autonomously.

6. The system of claim 1, wherein the phase reference signal further comprises a synchronization reference generated by the at least one other IED of the plurality of IEDs.

7. The system of claim 1, wherein the common time signal is received from a GPS system.

8. The system of claim 1, wherein the common time signal is configured to coordinate operations of the plurality of IEDs.

9. The system of claim 1, wherein each IED of the plurality of IEDs is further configured to control the speed of the at least one generator of the plurality of generators based on centralized synchronization information received from a central IED.

10. A method for managing an electric power generation and delivery system comprising:
    determining, by a first intelligent electronic device (IED) configured to control the speed of a first generator, that the first IED and the first generator while generating electric power have been isolated to an isolated sub-grid of the electric power generation and delivery system, the isolated sub-grid including a subset of IEDs of a plurality of IEDs of the electric power generation and delivery system;

receiving, at the first IED, a phase reference signal from a second IED of the subset of IEDs configured to control the speed of a second generator and a common time signal; and controlling, by the first IED, the speed of the first generator based on the phase reference signal and the common time signal.

11. The method of claim 10, wherein the method further comprises:

receiving, at the first IED, system information from one or more monitoring IEDs included in the electric power generation and delivery system, wherein controlling the speed of the first generator is further based on the system information.

12. The method of claim 11, wherein the system information comprises synchronized phasor information.

13. The method of claim 10, wherein the phase reference signal further comprises information for determining that the first IED should operate autonomously in controlling the speed of the first generator.

14. The method of claim 10, wherein the comprises a synchronization reference generated by the at least one other IED of the plurality of IEDs.

15. The method of claim 10, wherein the common time signal is received from a GPS system.

16. The method of claim 10, wherein the common time signal is configured to coordinate operations of at least the first IED and the second IED.

17. The method of claim 10, wherein the method further comprises:

receiving, at the first IED, centralized synchronization information from a central IED, wherein controlling the speed of the first generator is further based on the centralized synchronization information.

* * * * *